(12) United States Patent
Muramatsu et al.

(10) Patent No.: US 7,183,196 B2
(45) Date of Patent: Feb. 27, 2007

(54) MULTILAYER INTERCONNECTION BOARD AND PRODUCTION METHOD THEREOF

(75) Inventors: Shigetsugu Muramatsu, Nagano (JP); Masato Tanaka, Nagano (JP); Katsumi Yamazaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 23 days.

(21) Appl. No.: 11/026,971

(22) Filed: Dec. 30, 2004

(65) Prior Publication Data

US 2005/0146038 A1    Jul. 7, 2005

(30) Foreign Application Priority Data

Jan. 6, 2004    (JP)    ............... 2004-001419

(51) Int. Cl.
*H01L 21/4763* (2006.01)
*H01L 21/44* (2006.01)
*H01L 21/48* (2006.01)
*H01L 21/52* (2006.01)
*H01L 21/40* (2006.01)

(52) U.S. Cl. ............... 438/622; 438/618; 438/660; 438/665; 438/652; 438/689; 438/624; 257/758; 257/760; 257/295; 257/E21.575; 257/E21.585

(58) Field of Classification Search ........... 438/622, 438/618, 624, 652, 660, 665, 689; 257/758, 257/760, 295
See application file for complete search history.

(56) References Cited

U.S. PATENT DOCUMENTS

| 6,783,652 | B2* | 8/2004 | Iijima et al. ............ 205/125 |
| 2004/0056289 | A1* | 3/2004 | Ooishi .................. 257/295 |
| 2004/0188843 | A1* | 9/2004 | Wakayama et al. ...... 257/758 |

* cited by examiner

*Primary Examiner*—Walter Lindsay, Jr.
*Assistant Examiner*—Mohsen Ahmadi
(74) *Attorney, Agent, or Firm*—Ladas & Parry LLP

(57) ABSTRACT

A multilayer interconnection board is disclosed that allows reliable electrical connection between an interconnection having a large width and a large area and a via provided in a via hole formed by pressing a tool against resin. A projecting portion for electrical connection is formed integrally with the insulating member and in a second interconnection groove having a width and an area greater than those of a first interconnection groove. While a first interconnection is being deposited in the first interconnection groove and a second interconnection is being deposited in the second interconnection groove, the projecting portion is formed in the second interconnection groove and a metal plating film is provided on the projecting portion at the same time, so as to electrically connect the second interconnection with the via.

5 Claims, 15 Drawing Sheets

MULTILAYER INTERCONNECTION BOARD AND PRODUCTION METHOD THEREOF

BACKGROUND OF THE INVENTION

1. Field of the Invention

The present invention relates to a multilayer interconnection board and a method of producing the multilayer interconnection board, and particularly, to a multilayer interconnection board and a production method thereof, in which a first interconnection and a second interconnection having a width and an area greater than a width and an area of the first interconnection are formed in the same layer, a via hole is formed in a resin member on the second interconnection by imprinting press, and a via is provided in the via hole.

2. Description of the Related Art

Along with requirements of enhanced performance and decreased size of recent electronic communication apparatuses, development has been made in the field of print-circuit boards, specifically a multilayer interconnection board on which plural layers of interconnection circuits are formed to increase density of the circuits. For example, there is a kind of multilayer interconnection board produced by a so-called "build-up method", in which interconnection layers and insulating layers are stacked alternately, and vias are provided between an upper interconnection layer and a lower interconnection layer for connecting the two interconnection layers. Here, a "via" is a hole opened in an insulating layer and filled with metal for connection between conductive materials separated by the insulating layer.

In the build-up method, usually, first, a via hole is formed by a laser; next, an electric plating seed layer is formed by electric plating; and then, a plating resist is formed. After that, the via hole and an interconnection portion are filled with metal by electric plating. Finally, the seed layer on areas other than the plating resist and the interconnection portion is removed, thereby, obtaining the interconnection. This process is called as a "semi-additive process".

The interconnections to be connected by vias have widths distributed in a range from a few tens of microns to a few mm. Further, positions of vias relative to the interconnections are determined by layouts of layers in which the vias are formed. Hence, vias are formed at various positions relative to the interconnections as required.

In the above process, when opening a hole with a laser beam, a difference of material properties between the insulating layer and the metal of the conductive layer is utilized, and by using a laser beam having strength allowing the insulating layer only to be removed, the via hole is formed without removing the conductive metal.

However, in the build-up method of the related art, because it is necessary to form via holes separately, and after that, interconnection patterns are formed separately, the number of steps increases along with an increasing number of the layers, and this increases cost of fabrication.

To solve this problem, recently, a method has been proposed in which a tool having projecting portions formed thereon for forming interconnection grooves and via holes is pressed against the insulating layer, that is, carrying out pressing working, so as to form the interconnection grooves and the via holes at one time. For example, Japanese Laid Open Patent Application No. 2002-171048 discloses such a technique. By imprinting press, the fabrication process can be simplified and the fabrication cost can be reduced.

Descriptions are made of a process of forming a multilayer interconnection board by imprinting press in the related art with reference to FIG. 1 through FIG. 6.

FIG. 1 is a cross-sectional view showing a step of forming interconnection grooves and via holes in a resin in the process of forming a multilayer interconnection board in the related art.

As illustrated in FIG. 1, plural first interconnection grooves 13 having widths of several microns and plural second interconnection grooves 14 (only one is illustrated in FIG. 1) having greater widths (for example, several mm) and greater areas than the first interconnection grooves 13 are formed in a resin 12, and the first interconnection grooves 13 and the second interconnection grooves 14 are formed in the same layer irregularly.

Here, a width of an interconnection groove is defined to be a size of the interconnection groove along a direction perpendicular to the longitudinal direction of the interconnection groove.

FIG. 2 is a cross-sectional view showing a step of plating a whole surface of an insulating film in the process of forming a multilayer interconnection board in the related art.

As illustrated in FIG. 2, in order to bury metal into the interconnection grooves and via holes formed in FIG. 1, plating is executed on the whole surface of an insulating film.

When burying a plating film 17 into the first interconnection grooves 13, the second interconnection grooves 14, and via holes 15, since the first interconnection grooves 13 and the via holes 15 are fine patterns, appropriate plating conditions are required in order to obtain good burying properties of the first interconnection grooves 13 and the via holes 15. When such plating conditions are used, however, because the second interconnection grooves 14 have greater widths and greater areas than the first interconnection grooves 13, the second interconnection grooves 14 degrade cannot be buried sufficiently, as illustrated in FIG. 2.

FIG. 3 is a cross-sectional view showing a step of partially removing metal from the surface of the insulating film in the process of forming a multilayer interconnection board in the related art.

As illustrated in FIG. 3, the metal layer formed in FIG. 2 is partially removed by polishing from areas other than those used as interconnections and vias until the surface of the insulating film is exposed, thereby, forming interconnections in the resin 12.

As described above, when an interconnection groove has a large width, and the metal buried by plating in the interconnection groove is not sufficient, as illustrated in FIG. 3, while first interconnections 19 formed in the first interconnection grooves 13 are in good shape, second interconnections 22 formed in the second interconnection grooves 14 have insufficient heights, and in a region A, a plating film 17 does not exist from the upper surfaces 22A of the second interconnections 22 to the upper surface 12A of the resin 12.

FIG. 4 is a cross-sectional view showing a step of imprinting press on the structure in FIG. 3 in the process of forming a multilayer interconnection board in the related art.

As illustrated in FIG. 4, a resin 24 is provided on the structure in FIG. 3, and a tool is pressed against the resin 24 to form interconnection grooves 28 and via holes 26. Because the portion of the bottom surface 26A of the tool corresponding to one of the via holes 26 is set to be in contact with the upper surface 12A of the resin member 12, and because the plating film 17 does not exist in the second interconnection 22 from the upper surfaces 22A of the second interconnection 22 to the upper surface 12A of the resin 12, the via hole 26 cannot reach the second interconnections 22, and the resin 24 buries the region A in the second interconnection 22. Hence, there arises a problem in that vias and the second interconnections 22 are not electrically connected even when the via hole 26 is filled with metal.

SUMMARY OF THE INVENTION

Accordingly, it is a general object of the present invention to solve one or more problems of the related art.

A specific object of the present invention is to provide a multilayer interconnection board that allows reliable electrical connection between an interconnection having a large width and a large area and a via provided in a via hole formed by pressing a tool against a resin, and a method of producing the multilayer interconnection board.

According to a first aspect of the present invention, there is provided a multilayer interconnection board, comprising: a plurality of stacked interconnection layers, each of said interconnection layers including a first interconnection that is formed by plating a metal in a first interconnection groove in an insulating member, and a second interconnection that is formed by plating a metal in a second interconnection groove in the insulating member, said second interconnection groove having a width and an area greater than a width and an area of the first interconnection groove; and a via formed between the interconnection layers near the second interconnection for electrically connecting the second interconnections in different interconnection layers, wherein a projecting portion for electrical connection is formed integrally with the insulating member in the second interconnection groove, and metal is provided on the projecting portion to electrically connect the second interconnection with the via.

According to the present invention, even when the metal buried in the second interconnection groove is not sufficient, because of the projecting portion for electrical connection formed integrally with the insulating member in the second interconnection groove, and the metal provided on the projecting portion, the metal on the projecting portion electrically connects the second interconnection with the via.

In an embodiment, a height of the projecting portion is equal to a depth of the second interconnection groove, and the metal provided on the projecting portion and the metal provided on an upper surface of the projecting portion form a flat surface.

According to the present invention, because the height of the projecting portion is equal to the depth of the second interconnection groove, and the metal provided on the projecting portion and the metal provided on an upper surface of the projecting portion form a flat surface, even after surface polishing is performed for removing metal on the surface of the resin other than the interconnection patterns, the metal provided on the projecting portion can still be in contact with the via.

In an embodiment, the projecting portion is substantially a cylindrical projection.

According to the present invention, the metal on the periphery of the cylindrical projection can electrically connect the second interconnection with the via.

In an embodiment, the projecting portion is substantially a cross-shaped projection.

According to the present invention, the metal on the periphery of the cross-shaped projection can reliably electrically connect the second interconnection with the via.

In an embodiment, the projecting portion has cross-shaped grooves at a center portion thereof.

According to the present invention, because the projecting portion has cross-shaped grooves at its center portion, metal can be formed not only at the periphery of the cross projecting portion, but also in the cross-shaped grooves, hence the contact area between the via and the metal increases, and this allows reliable electrical connection between the second interconnection and the via.

According to a second aspect of the present invention, there is provided a method of producing a multilayer interconnection board, comprising the steps of forming, by imprinting press, a first interconnection groove, a second interconnection groove having a width and an area greater than a width and an area of the first interconnection groove, and a projecting portion in the second interconnection groove in an insulating member at one time; and providing metal in the first interconnection groove and the second interconnection groove to form a first interconnection in the first interconnection groove and a second interconnection in the second interconnection groove, and providing the metal on the projecting portion, wherein the metal on the projecting portion electrically connects a via formed near the second interconnection and the second interconnection.

According to the present invention, because the first interconnection groove, the second interconnection groove, and the projecting portion in the second interconnection groove are formed at the same time, and the metal is provided on the projecting portion at the same time when providing the metal in the first interconnection groove and the second interconnection groove to form the first interconnection and the second interconnection, the projecting portion with metal thereon can be formed without increasing the number of fabrication steps, and the metal provided on the projecting portion can electrically connect the second interconnection with the via even after surface polishing is performed for removing metal on the surface of the resin other than the interconnection patterns.

In an embodiment, a height of the projecting portion is equal to a depth of the second interconnection groove, and the metal provided on the projecting portion and an upper surface of the projecting portion form a flat surface.

According to the present invention, because the height of the projecting portion is equal to the depth of the second interconnection groove, and the metal provided on the projecting portion and an upper surface of the projecting portion form a flat surface, even after surface polishing is performed for removing metal on the surface of the resin other than the interconnection patterns, the metal provided on the projecting portion can still be in contact with the via.

In an embodiment, the projecting portion is substantially a cylindrical projection.

According to the present invention, the metal on the periphery of the cylindrical projection can electrically connect the second interconnection with the via even after surface polishing is performed for removing metal on the surface of the resin other than the interconnection patterns.

In an embodiment, the projecting portion is substantially a cross-shaped projection.

According to the present invention, the metal on the periphery of the cross-shaped projection can reliably electrically connect the second interconnection with the via even after surface polishing is performed for removing metal on the surface of the resin other than the interconnection patterns.

In an embodiment, the projecting portion has cross-shaped grooves at a center portion thereof.

According to the present invention, because the projecting portion has cross-shaped grooves at its center portion, metal can be formed not only at the periphery of the cross projecting portion, but also in the grooves, hence the contact area between the via and the metal increases, and this allows reliable electrical connection between the second interconnection and the via even after surface polishing is performed for removing metal on the surface of the resin other than the interconnection patterns.

These and other objects, features, and advantages of the present invention will become more apparent from the following detailed description of the preferred embodiments given with reference to the accompanying drawings.

DESCRIPTION OF THE PREFERRED EMBODIMENTS

Below, preferred embodiments of the present invention are explained with reference to the accompanying drawings.

First Embodiment

Figure 1:
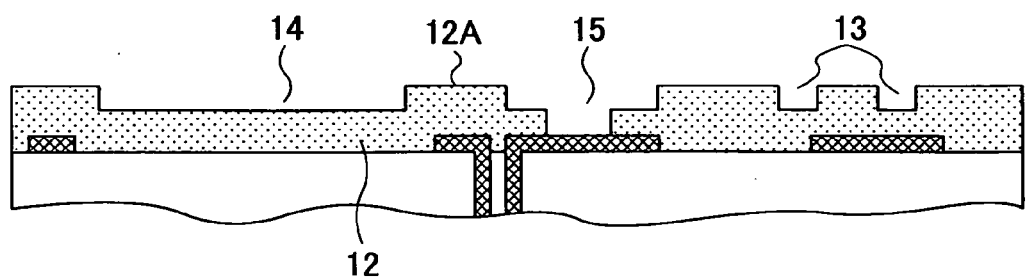
FIG. 1 is a cross-sectional view showing a step of forming interconnection grooves and via holes in a resin in the process of forming a conventional multilayer interconnection.
Figure 2:
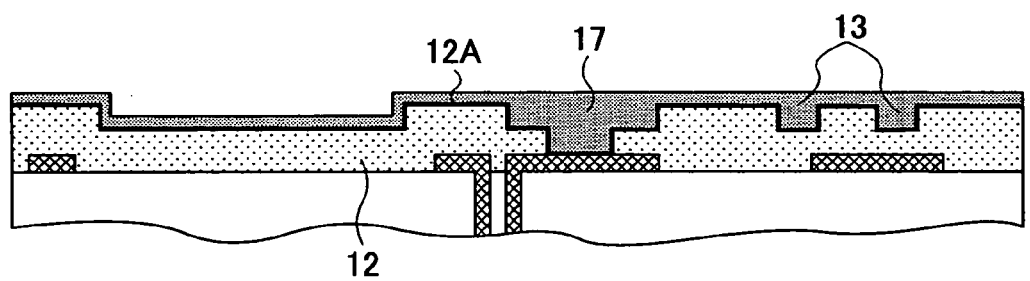
FIG. 2 is a cross-sectional view showing a step of plating a whole surface of an insulating film in the process of forming a multilayer interconnection.
Figure 3:
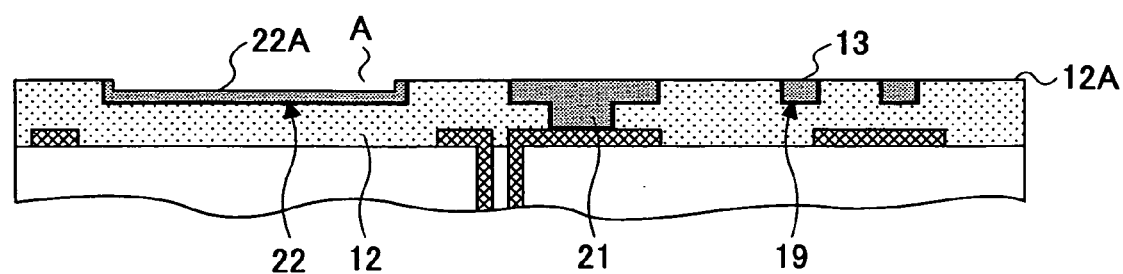
FIG. 3 is a cross-sectional view showing a step of partially removing metal from the surface of the insulating film in the process of forming a multilayer interconnection.
Figure 4:
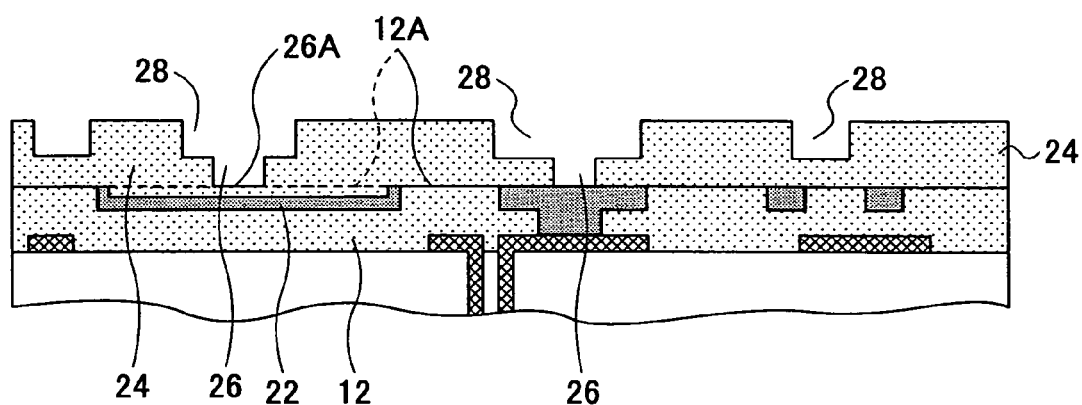
FIG. 4 is a cross-sectional view showing a step of imprinting press on the structure in FIG. 3 in the process of forming a multilayer interconnection.
Figure 5:
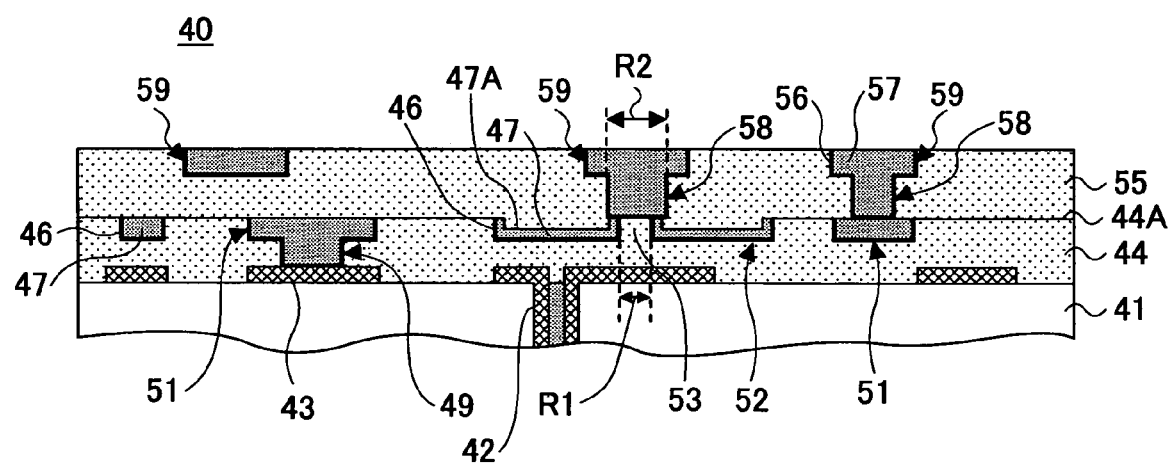
FIG. 5 is a cross-sectional view of a multilayer interconnection board according to a first embodiment of the present invention.

FIG. 5 is a cross-sectional view of a multilayer interconnection board according to a first embodiment of the present invention.

As illustrated in FIG. 5, a multilayer interconnection board 40 is a build-up board with multilayer interconnection structures formed on two sides of a substrate 41 (also referred to as a core substrate). The multilayer interconnection board 40 includes the substrate 41, a through-hole electrode 42 inside the substrate 41, an interconnection 43 formed on the surface of the substrate 41, insulating resin 44 on the substrate 41, a via 49 in the insulating resin 44, a first interconnection 51, a second interconnection 52 having a width and an area greater than a width and an area of the first interconnection 51, a projecting portion 53 for electrical connection, insulating resin 55 on the insulating resin 44, and a via 58 and an interconnection 59 in the insulating resin 55.

The through-hole electrode 42 is for electrically connecting the multilayer interconnection structure formed on the front side of the substrate 41 and the multilayer interconnection structure formed on the back side of the substrate 41. The via 49 is for electrically connecting the interconnection 43 and the first interconnection 51. Although not illustrated, where necessary, the interconnection 43 and the second interconnection 52 are also electrically connected by the via 49.

The first interconnection 51 is a fine interconnection having a width of several tens of microns, the second interconnection 52 having a width and an area greater than those of the first interconnection 51. Here, a width of an interconnection is defined to be a size of the interconnection along a direction perpendicular to the longitudinal direction of the interconnection.

The second interconnection 52, for example, has a width of several millimeters so as to function as a power interconnection.

The via 49, the first interconnection 51, and the second interconnection 52 are formed in the following way. First, a seed layer 46, which is a metal in grooves in the resin 44, is formed by electric plating on the whole surface of the resin 44. Then, a plating film 47 is formed by electric plating, and the plating film 47 on areas other than the interconnection portion is removed by surface polishing. Plating conditions of forming the plating film 47 are chosen to be suitable for burying metal in the via 49 and the first interconnection 51, which are fine patterns. For this reason, the upper surface 47A of the plating film 47 formed in the second interconnection 52 is lower than the upper surface 44A of the resin 44, that is, the interface between the resin 44 and the resin 55.

Figure 6:
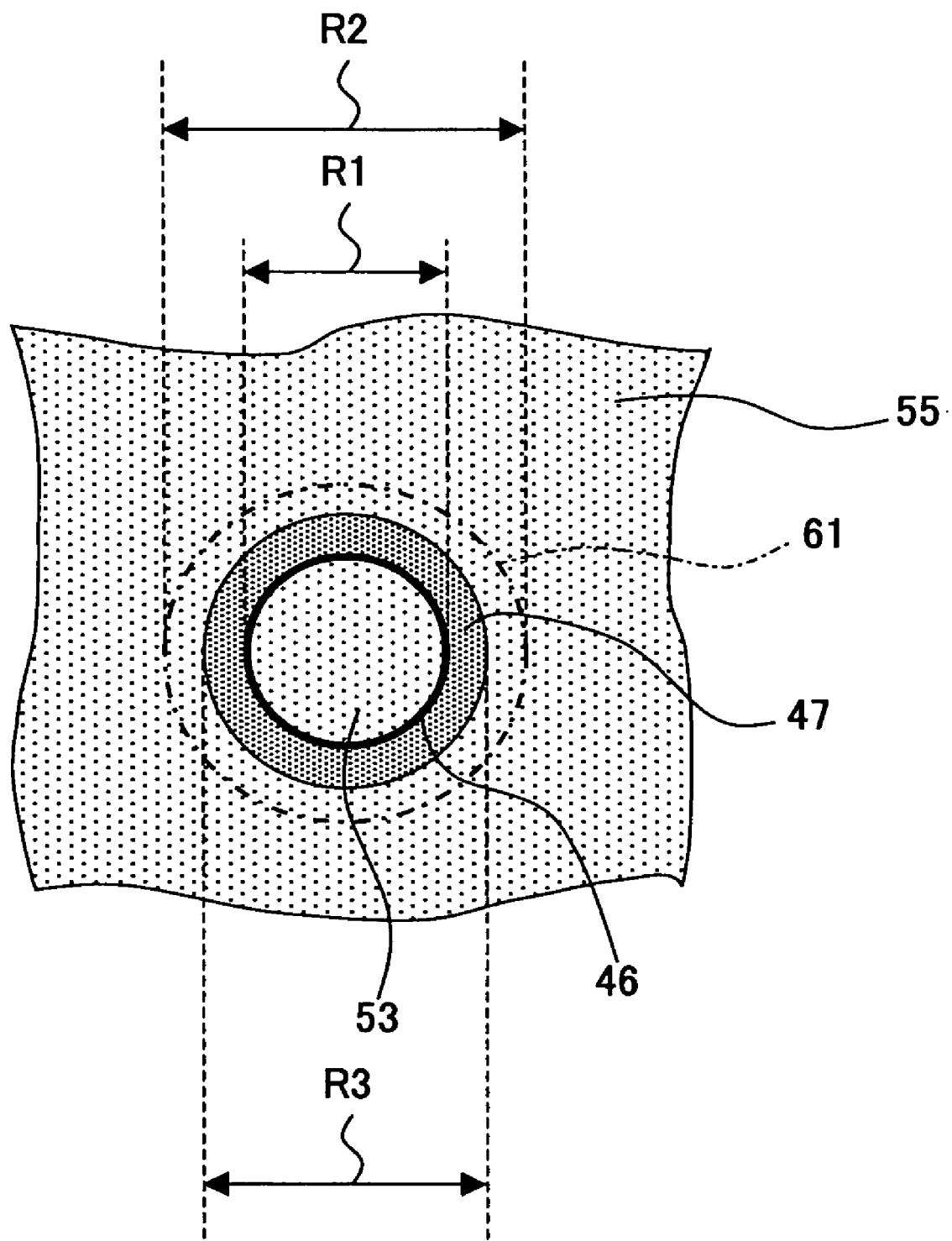
FIG. 6 is a plan view of the projecting portion 53 shown in FIG. 5.

FIG. 6 is a plan view of the projecting portion 53 shown in FIG. 5. In FIG. 6, the position of a via 58 is indicated by a dot-dashed line to make the position relation between the via 61 and the projecting portion 53 easily understood.

In FIG. 6, the projecting portion 53 is a cylinder, and is integral with the resin 44. The diameter R1 of the projecting portion 53 is set to be less than the diameter R2 of the via 58, and preferably, the diameter R3 of the projecting portion 53 and the plating film 47 is less than the diameter R2 of the via 58. The projecting portion 53 is provided at a connection position of the via 58 above the second interconnection 52.

The seed layer 46 and the plating film 47 surround side surfaces of the projecting portion 53, and form a flat surface with the upper surface of the projecting portion 53, and the seed layer 46 and the plating film 47 are electrically connected with the second interconnection 52.

The seed layer 46, for example, may be a titanium film, a copper film, or a Cr film formed by sputtering, CVD, or electric plating. The plating film 47 may be a copper film formed by electric plating.

The via 58 below the interconnection 59 is arranged to be in contact with the upper surface of the projecting portion 53, the seed layer 46, and the plating film 47. The via 58 is for electrically connecting the first interconnection 51, or the second interconnection 52 with the interconnection 59.

The via 58 and the interconnection 59 are formed from a seed layer 56 and a plating film 57. For example, the seed layer 56 may be a titanium film, a copper film, or a Cr film formed by sputtering, CVD, or electric plating. The plating film 57 may be a copper film formed by electric plating.

In this way, the diameter R1 of the projecting portion 53 is set to be less than the diameter R2 of the via 58, and more preferably, the diameter R3 of the projecting portion 53 enclosed by the plating film 47 is formed to be less than the diameter R2 of the via 58. Further, the plating film 47 is provided on the projecting portion 53, the second interconnection 52, which has a width and an area greater than those of the first interconnection 51, and is electrically connected with the via 58.

Below, a tool 65 for forming the projecting portion 53 of the present embodiment is described with reference to FIG. 7 and FIG. 8.

Figure 7:
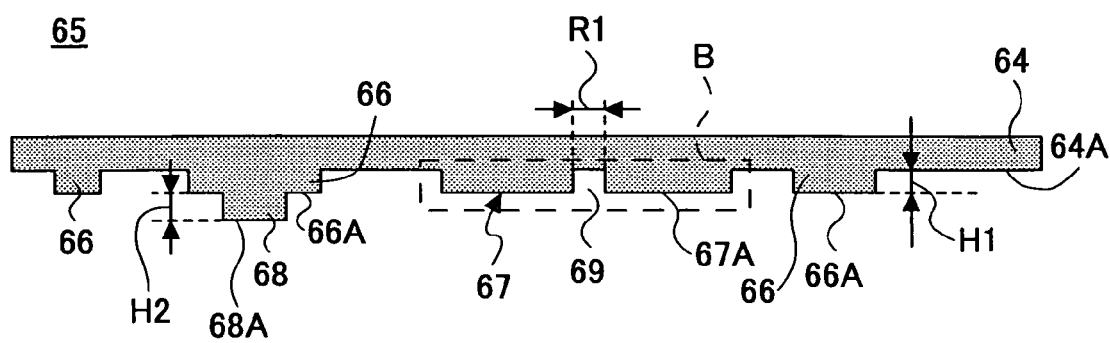
FIG. 7 is a cross-sectional view of the tool 65 for forming the projecting portion 53 of the present embodiment.

FIG. 7 is a cross-sectional view of the tool 65 for forming the projecting portion 53 of the present embodiment.

Figure 8:
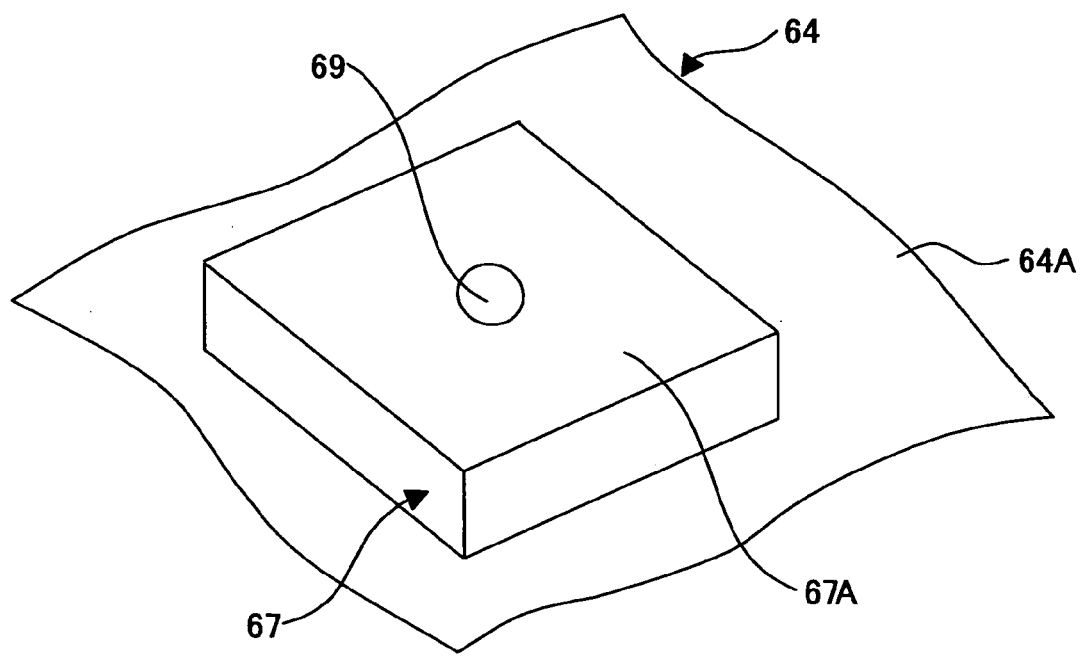
FIG. 8 is an enlarged perspective view of a portion B (indicated by dashed lines in FIG. 7) of the tool 65 for forming the second interconnection 52.

FIG. 8 is an enlarged perspective view of a portion B (indicated by dashed lines in FIG. 7) of the tool 65 for forming the second interconnection 52.

As illustrated in FIG. 7, the tool 65 includes a substrate 64, a first projecting portion 66 for forming a first interconnection groove 72 (refer to FIG. 11), which is a depressed portion, a second projecting portion 67 for forming a depressed second interconnection groove 73 (refer to FIG. 11) having a width and an area greater than those of the first interconnection groove 72, a third projecting portion 68 for forming a via hole 71 (refer to FIG. 11), and a recess 69 for forming the projecting portion 53.

The first interconnection groove 72 is for forming the first interconnection 51, and the second interconnection groove 73 is for forming the second interconnection 52.

The first projecting portion 66 and the second projecting portion 67 are provided in the substrate 64, and the height H1 from the surface 64A of the substrate 64 to the surface 66A of the first projecting portion 66, or the surface 67A of the second projecting portion 67 is set to correspond to the depth of the first interconnection groove 72 and the second interconnection groove 73.

The third projecting portion 68 is provided to be adjacent to the first projecting portion 66, the height H2 from the surface 66A of the first projecting portion 66 to the surface 68A of the third projecting portion 68 is set to correspond to the depth of the via hole 71. Although not illustrated in FIG. 7, when necessary, the third projecting portion 68 may be provided on the second projecting portion 67.

The recess 69 is formed in the second projecting portion 67. The depth of the recess 69 is set to equal H1.

Because the recess 69 is formed in the second projecting portion 67, when the tool 65 is pressed against the resin 44, that is, a process of imprinting press, when the first interconnection groove 72 and the second interconnection groove 73 are formed, the projecting portion 53 is also formed at a specified position in the second interconnection groove 73 at the same time.

Below, descriptions are made of the method for producing the multilayer interconnection board 40 of the present embodiment of the present invention with reference to FIG. 9 through FIG. 22.

Figure 9:
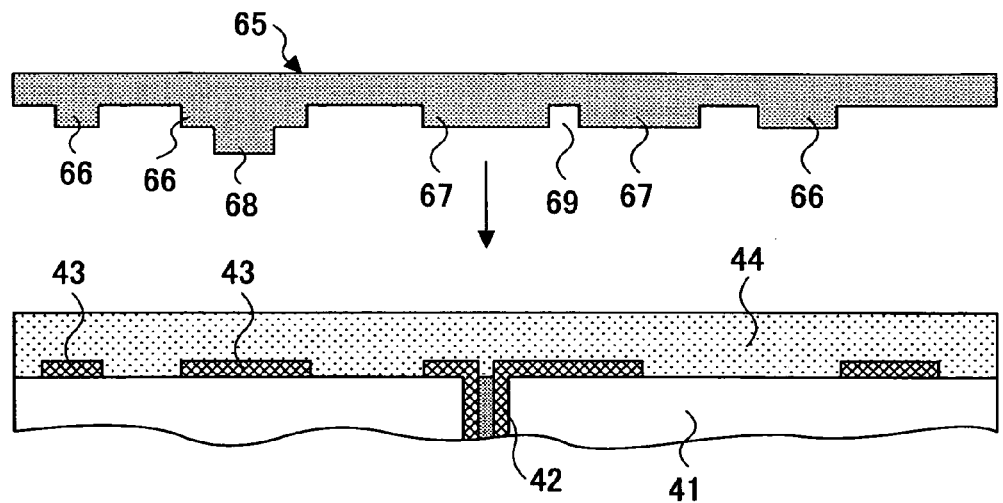
FIG. 9 is a cross-sectional view showing a step of the method of forming the multilayer interconnection board 40 according to the present embodiment of the present invention.

FIG. 9 is a cross-sectional view showing a step of the method of forming the multilayer interconnection board 40 according to the present embodiment of the present invention.

As illustrated in FIG. 9, the insulating resin 44 is provided on the substrate 41 in which the through-hole electrode 42 and the interconnections 43 are formed.

Figure 10:
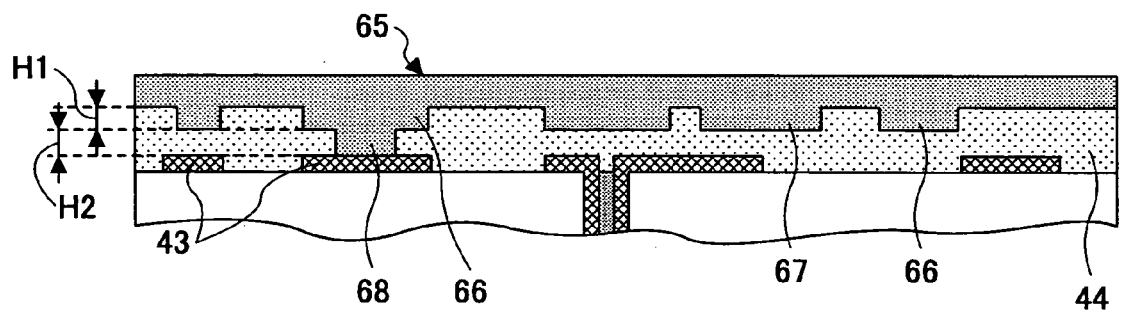
FIG. 10, continuing from FIG. 9, is a cross-sectional view showing a step of the method of forming the multilayer interconnection board 40 according to the present embodiment of the present invention.

FIG. 10, continuing from FIG. 9, is a cross-sectional view showing a step of the method of forming the multilayer interconnection board 40 according to the present embodiment of the present invention.

As illustrated in FIG. 10, the tool 65 is pressed against the insulating resin 44 to carry out imprinting press.

Figure 11:
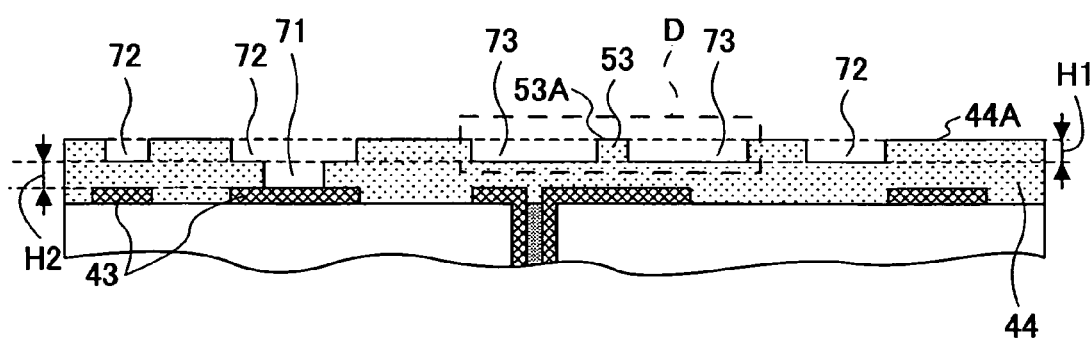
FIG. 11, continuing from FIG. 10, is a cross-sectional view showing a step of the method of forming the multilayer interconnection board 40 according to the present embodiment of the present invention.

FIG. 11, continuing from FIG. 10, is a cross-sectional view showing a step of the method of forming the multilayer interconnection board 40 according to the present embodiment of the present invention.

As illustrated in FIG. 11, the tool 65 is removed after the resin 44 cures. Thereby, the via hole 71 having a depth H2, the first interconnection groove 72 having a depth H1, the second interconnection groove 73 having a depth H1, and the projecting portion 53 having a height H1 at a specified position in the second interconnection groove 72 are formed at the same time in the insulating resin 44. The second interconnection groove 73 has a width and an area greater than those of the first interconnection groove 72.

Figure 12:
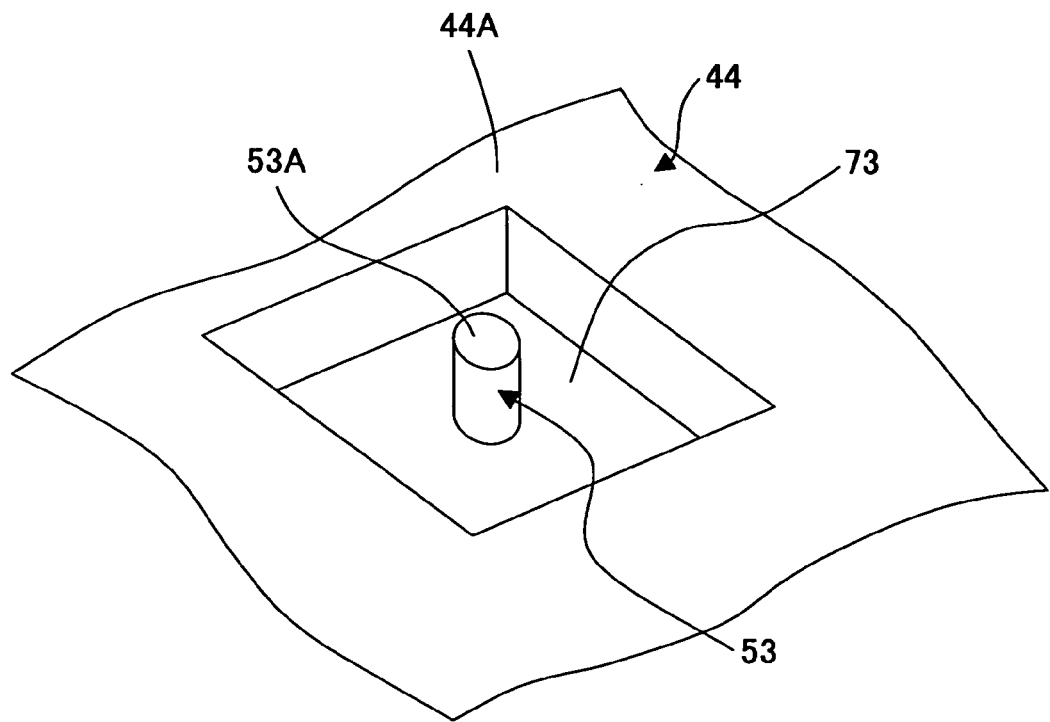
FIG. 12 is an enlarged perspective view of a portion D (indicated by dashed lines in FIG. 11) of the multilayer interconnection board 40, illustrating the projecting portion 53.

FIG. 12 is an enlarged perspective view of a portion D (indicated by dashed lines in FIG. 11) of the multilayer interconnection board 40, illustrating the projecting portion 53.

Figure 13:
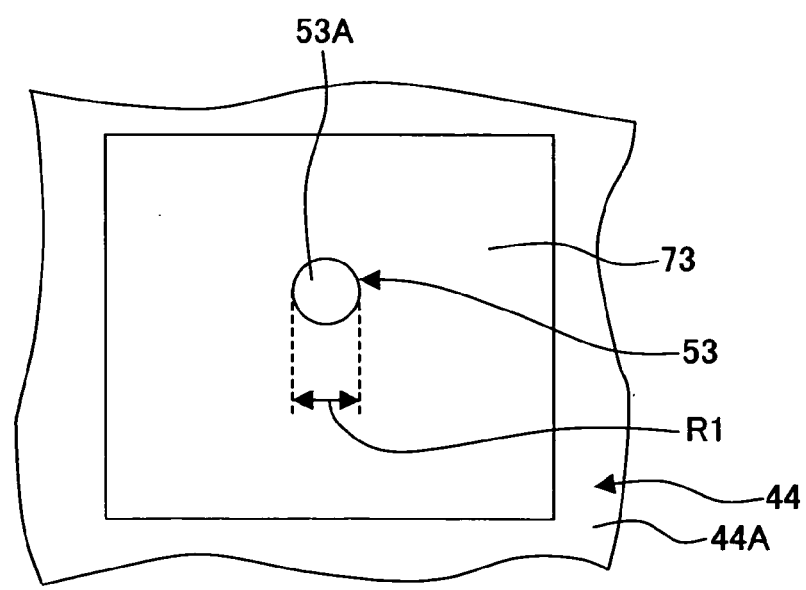
FIG. 13 is a plan view of the projecting portion 53 shown in FIG. 12.

FIG. 13 is a plan view of the projecting portion 53 shown in FIG. 12.

As illustrated in FIG. 12 and FIG. 13, the projecting portion 53 is a cylinder having a diameter of R1, and is formed to be integral with the insulating resin 44 at a specified position in the second interconnection groove 73.

Figure 14:
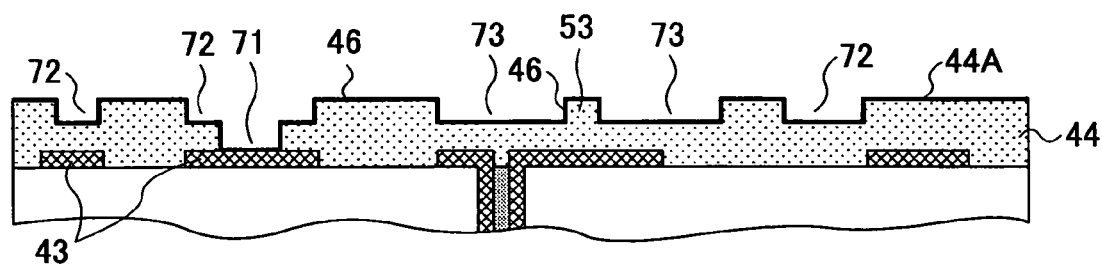
FIG. 14, continuing from FIG. 11, is a cross-sectional view showing a step of the method of forming the multilayer interconnection board 40 according to the present embodiment of the present invention.

FIG. 14, continuing from FIG. 11, is a cross-sectional view showing a step of the method of forming the multilayer interconnection board 40 according to the present embodiment of the present invention.

As illustrated in FIG. 14, the seed layer 46, which is required during plating, is formed inside the via hole 71, the first interconnection groove 72, the second interconnection groove 73, and on the upper surface 44A of the insulating resin 44. The seed layer 46, for example, may be a titanium film, a copper film, or a Cr film formed by sputtering, CVD, or electric plating.

Figure 15:
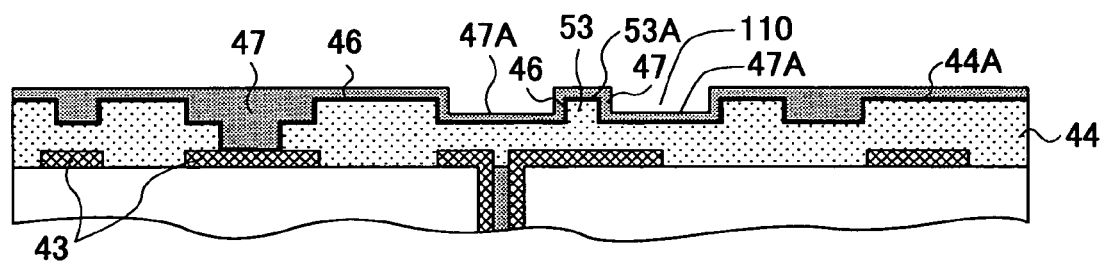
FIG. 15, continuing from FIG. 14, is a cross-sectional view showing a step of the method of forming the multilayer interconnection board 40 according to the present embodiment of the present invention.

FIG. 15, continuing from FIG. 14, is a cross-sectional view showing a step of the method of forming the multilayer interconnection board 40 according to the present embodiment of the present invention.

As illustrated in FIG. 15, the plating film 47 is formed on the seed layer 46 by electric plating. In electric plating, the plating film 47 is formed in the first interconnection groove 72, the second interconnection groove 73, and on the upper surface 53A and side surface of the projecting portion 53.

In this step, because the upper surface of the plating film 47 buried in the second interconnection groove 73 is lower than the upper surface 44A of the insulating resin 44, a depression 110 appears in the second interconnection groove 73.

Here, the plating conditions of forming the plating film 47 are chosen to be suitable for burying metal in the via hole 71 and the first interconnection 72, which are fine patterns having widths of several tens of microns. The plating film 47 may be a copper film formed by electric plating.

Figure 16:
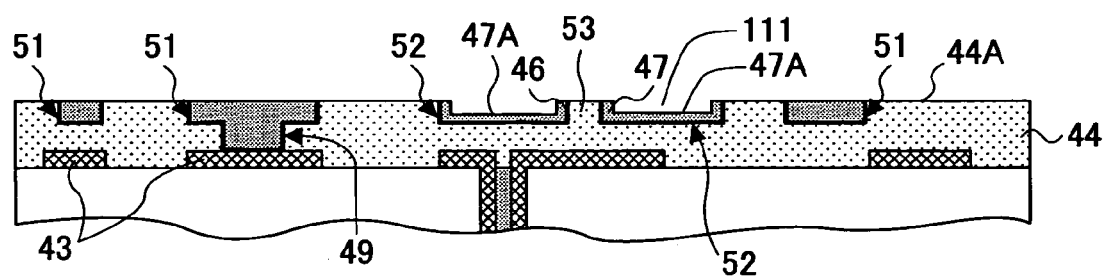
FIG. 16, continuing from FIG. 15, is a cross-sectional view showing a step of the method of forming the multilayer interconnection board 40 according to the present embodiment of the present invention.

FIG. 16, continuing from FIG. 15, is a cross-sectional view showing a step of the method of forming the multilayer interconnection board 40 according to the present embodiment of the present invention.

As illustrated in FIG. 16, unnecessary portions of the seed layer 46 and the plating film 47 are removed by polishing until the upper surface 44A of the insulating resin 44 is exposed, thereby forming the first interconnection 51, the via 49 connected to the interconnection 43, and the second interconnection 52 having a width and an area greater than those of the first interconnection 51. During the polishing process, the upper surface 53A of the projecting portion 53 is exposed, and on the surface of the projecting portion 53, a metal layer including the seed layer 46 and the plating film 47 is deposited so as to form a flat surface with the upper surface 53A of the projecting portion 53. In addition, a depressed portion 111 is formed between the upper surface 47A of the plating film 47 formed in the second interconnection groove 73 and the upper surface 44A of the resin 44.

Figure 17:
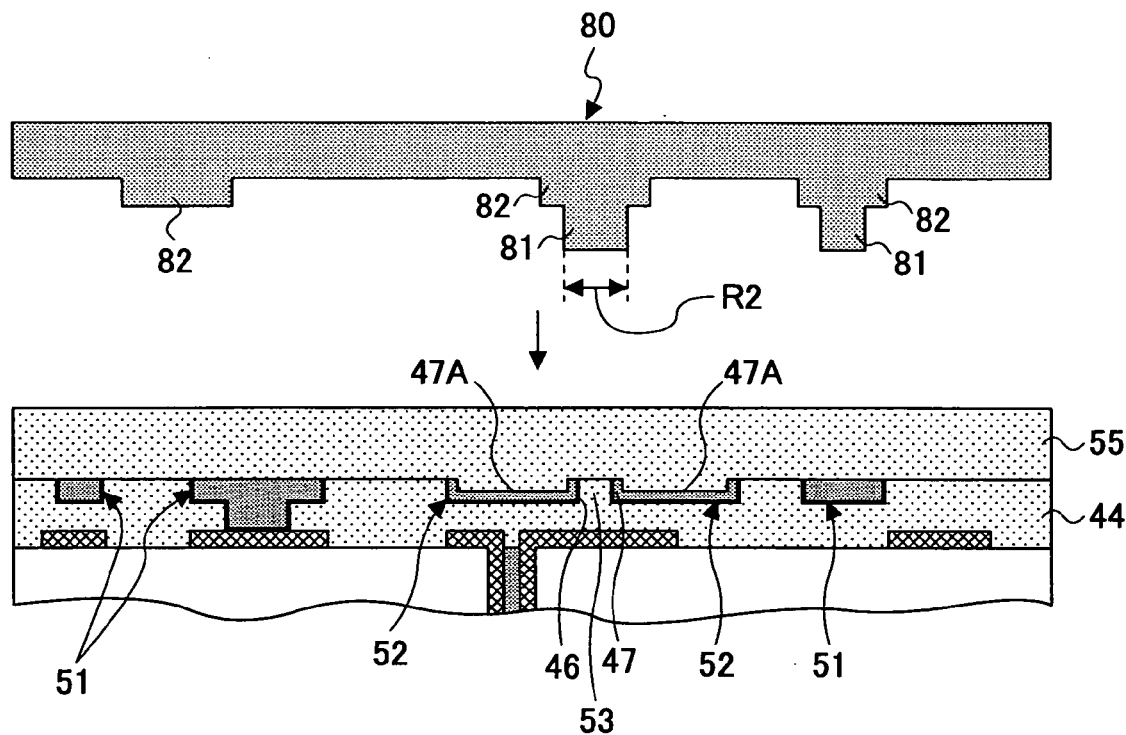
FIG. 17, continuing from FIG. 16, is a cross-sectional view showing a step of the method of forming the multilayer interconnection board 40 according to the present embodiment of the present invention.

FIG. 17, continuing from FIG. 16, is a cross-sectional view showing a step of the method of forming the multilayer interconnection board 40 according to the present embodiment of the present invention.

As illustrated in FIG. 17, the insulating resin 55 is provided on the structure shown in FIG. 16.

Figure 18:
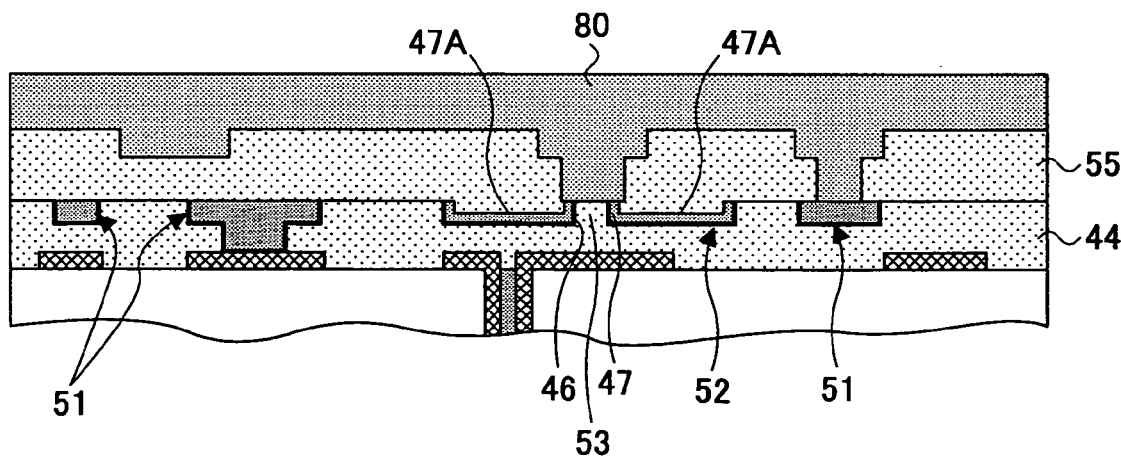
FIG. 18, continuing from FIG. 17, is a cross-sectional view showing a step of the method of forming the multilayer interconnection board 40 according to the present embodiment of the present invention.

FIG. 18, continuing from FIG. 17, is a cross-sectional view showing a step of the method of forming the multilayer interconnection board 40 according to the present embodiment of the present invention.

As illustrated in FIG. 18, a tool 80 is pressed against the insulating resin 55 to carry out imprinting press. The tool 80 includes a projecting portion 82 for forming interconnection grooves, and a projecting portion 81 for forming via holes. Hence, the projecting portion 81 of the tool 80 is brought into contact with the projecting portion 53 or the first interconnection 51.

When the insulating resin 55 is provided, the depression 111 is buried by the resin 55.

Figure 19:
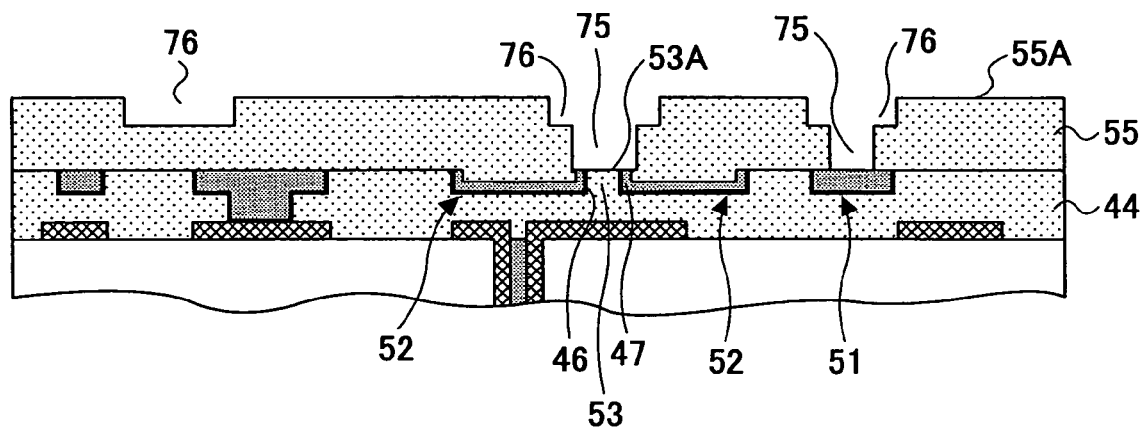
FIG. 19, continuing from FIG. 18, is a cross-sectional view showing a step of the method of forming the multilayer interconnection board 40 according to the present embodiment of the present invention.

FIG. 19, continuing from FIG. 18, is a cross-sectional view showing a step of the method of forming the multilayer interconnection board 40 according to the present embodiment of the present invention.

As illustrated in FIG. 19, the tool 80 is removed after the insulating resin 55 cures. Thereby, via holes 75 and interconnection grooves 76 are formed. The via hole 75 on the projecting portion 53 is formed such that the upper surface 53A of the projecting portion 53, and the seed layer 46 and the plating film 47 on the projecting portion 53 are exposed, and the via hole 75 on the first interconnection 51 is formed such that the first interconnection 51 is exposed.

Figure 20:
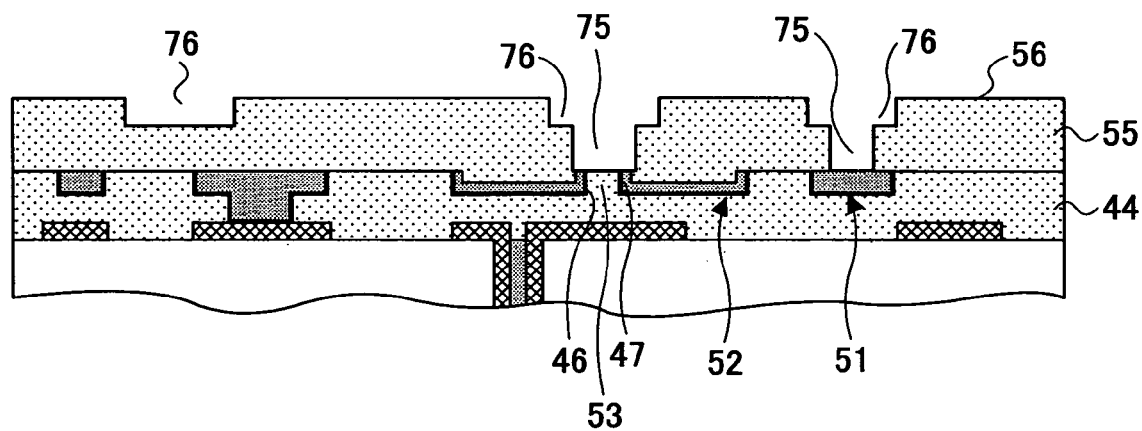
FIG. 20, continuing from FIG. 19, is a cross-sectional view showing a step of the method of forming the multilayer interconnection board 40 according to the present embodiment of the present invention.

FIG. 20, continuing from FIG. 19, is a cross-sectional view showing a step of the method of forming the multilayer interconnection board 40 according to the present embodiment of the present invention.

As illustrated in FIG. 20, the seed layer 56, which is required during plating, is formed inside the via holes 75, interconnection grooves 76, and on the upper surface 55A of the insulating resin 55. The seed layer 56, for example, may be a titanium film, a copper film, or a Cr film formed by sputtering, CVD, or electric plating.

Figure 21:
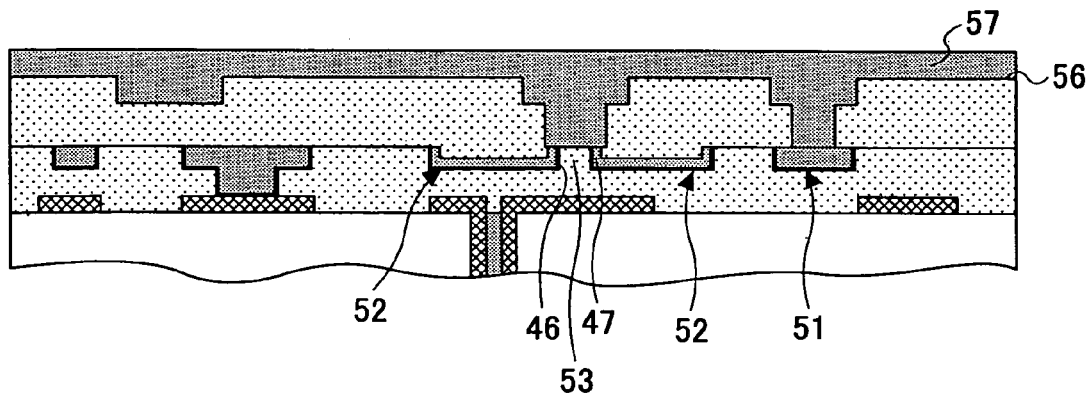
FIG. 21, continuing from FIG. 20, is a cross-sectional view showing a step of the method of forming the multilayer interconnection board 40 according to the present embodiment of the present invention.

FIG. 21, continuing from FIG. 20, is a cross-sectional view showing a step of the method of forming the multilayer interconnection board 40 according to the present embodiment of the present invention.

As illustrated in FIG. 21, a plating film 57 is formed on the seed layer 56 by electric plating. For example, the plating film 47 is a copper film formed by electric plating.

Figure 22:
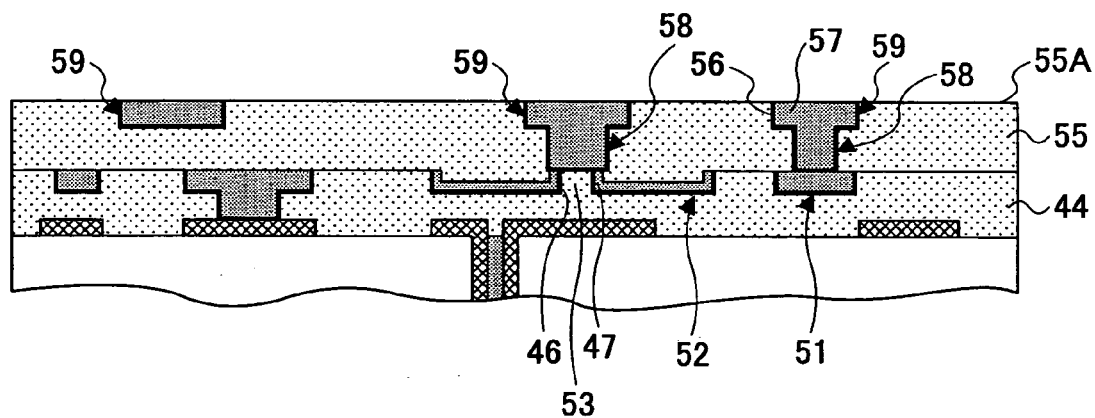
FIG. 22, continuing from FIG. 21, is a cross-sectional view showing a step of the method of forming the multilayer interconnection board 40 according to the present embodiment of the present invention.

FIG. 22, continuing from FIG. 21, is a cross-sectional view showing a step of the method of forming the multilayer interconnection board 40 according to the present embodiment of the present invention.

As illustrated in FIG. 22, unnecessary portions of the seed layer 56 and the plating film 57 are removed by polishing until the upper surface 55A of the insulating resin 55 is exposed, thereby, forming the interconnections 59 and the vias 58.

According to the method of forming the multilayer interconnection board 40 according to the present embodiment of the present invention, while the first interconnection groove 72, the second interconnection groove 73 are formed, the projecting portion 53 is also formed in the second interconnection groove 73 to be integral with the insulating resin 44 at the same time.

In addition, by providing a metal layer including the seed layer 46 and the plating film 47 on the projecting portion 53, and by setting plating conditions of forming the plating film 47 to be suitable for burying the plating film 47 in the via hole 71 and the first interconnection 72 which are fine patterns having widths of several tens of microns, even when the plating film 47 buried by plating in the second interconnection groove is not sufficient, the plating film 47 provided on the projecting portion 53 reliably electrically connects the second interconnection 52 with the via 58.

Second Embodiment

Below, a tool 90 used for forming a multilayer interconnection board according to a second embodiment of the present invention is described with reference to FIG. 23 and FIG. 24.

Figure 23:
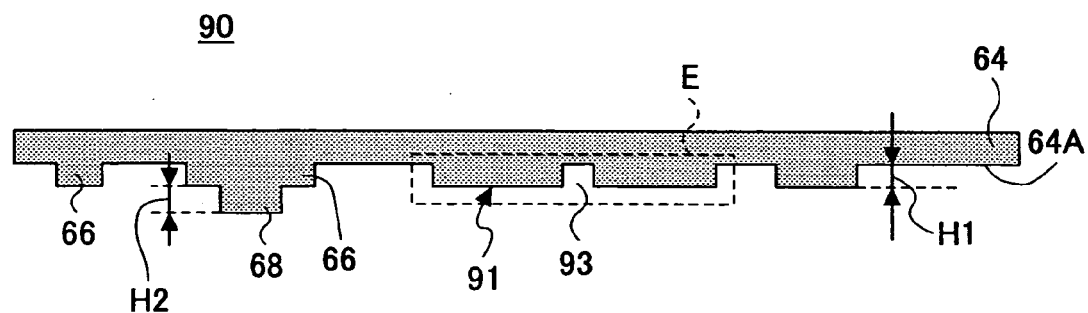
FIG. 23 is a cross-sectional view of the tool 90 for forming the multilayer interconnection board according to the second embodiment of the present invention.

FIG. 23 is a cross-sectional view of the tool 90 for forming the multilayer interconnection board according to the second embodiment of the present invention.

Figure 24:
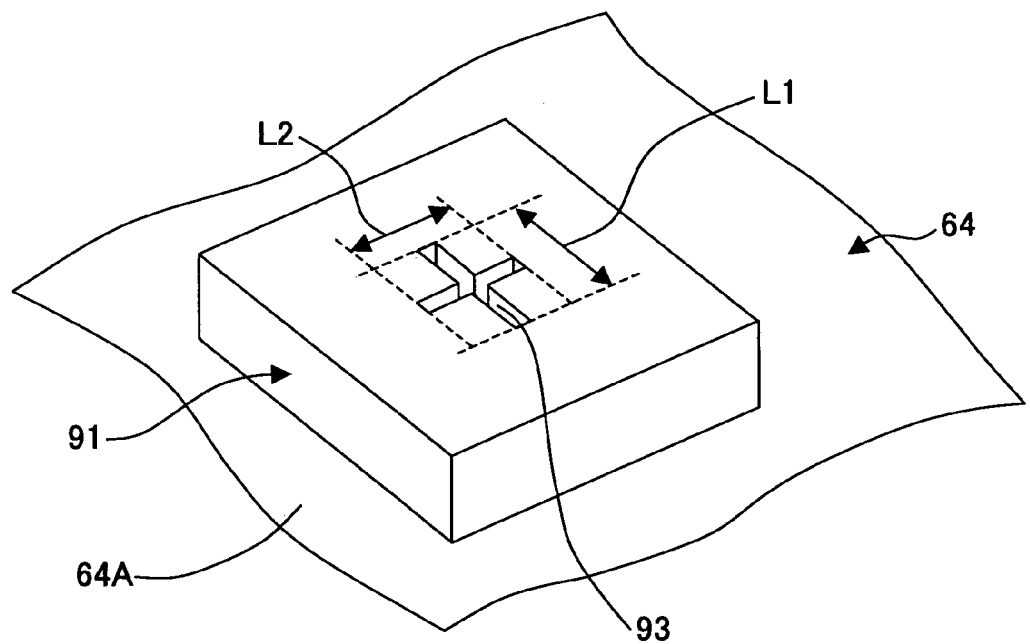
FIG. 24 is an enlarged perspective view of a portion E of the tool 90, as indicated by dashed lines in FIG. 23.

FIG. 24 is an enlarged perspective view of a portion E of the tool 90, as indicated by dashed lines in FIG. 23.

In FIG. 23 and FIG. 24, the same reference numbers are assigned to the same elements as those of the tool 65 shown in FIG. 7, and overlapping descriptions are omitted.

Figure 25:
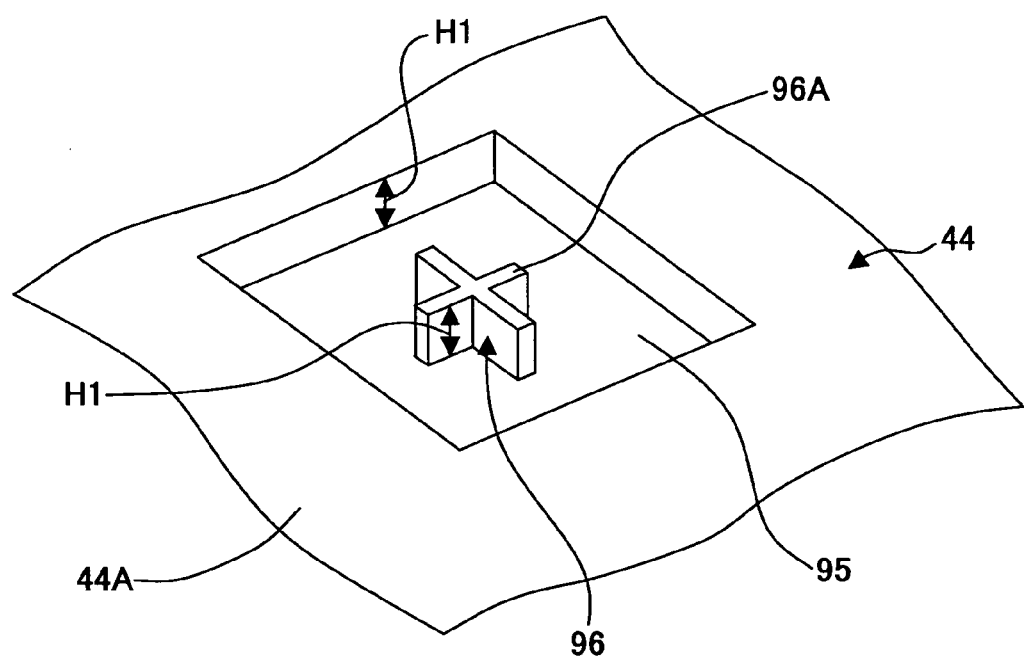
FIG. 25 is an enlarged perspective view of the projecting portion 96 formed by using the tool 90 in FIG. 23, according to the present embodiment of the present invention.

As illustrated in FIG. 23, the tool 90 includes a substrate 64, a first projecting portion 66 for forming a first interconnection groove, a second projecting portion 91 for forming a second interconnection groove having a width and an area greater than those of the first interconnection groove, a third projecting portion 68 for forming a via hole, and a recess 93 for forming a projecting portion 96 (refer to FIG. 25).

The recess 93 has a groove of a length L1 and a groove of a length L2, and is formed approximately to be a cross. The depth of the recess 93 is set to equal the depth H1 of the second interconnection groove. The lengths L1, L2 of the projecting portion 96 are set greater than the diameter R2 of the via 58 connected to the projecting portion 96.

Below, descriptions are made of the projecting portion 96 according to the present embodiment of the present invention with reference to FIG. 25 through FIG. 28. In FIG. 25 through FIG. 28, the same reference numbers are assigned to the same elements as those shown in FIG. 22, and overlapping descriptions are omitted.

FIG. 25 is an enlarged perspective view of the projecting portion 96 formed by using the tool 90 in FIG. 23, according to the present embodiment of the present invention.

Figure 26:
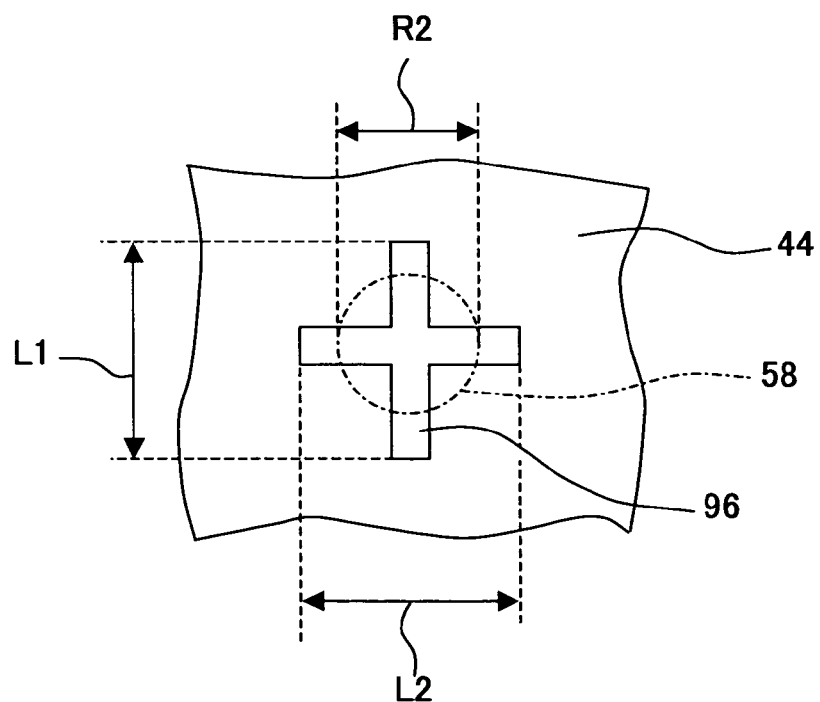
FIG. 26 is a plan view of the projecting portion 96 shown in FIG. 25.

FIG. 26 is a plan view of the projecting portion 96 shown in FIG. 25.

Figure 27:
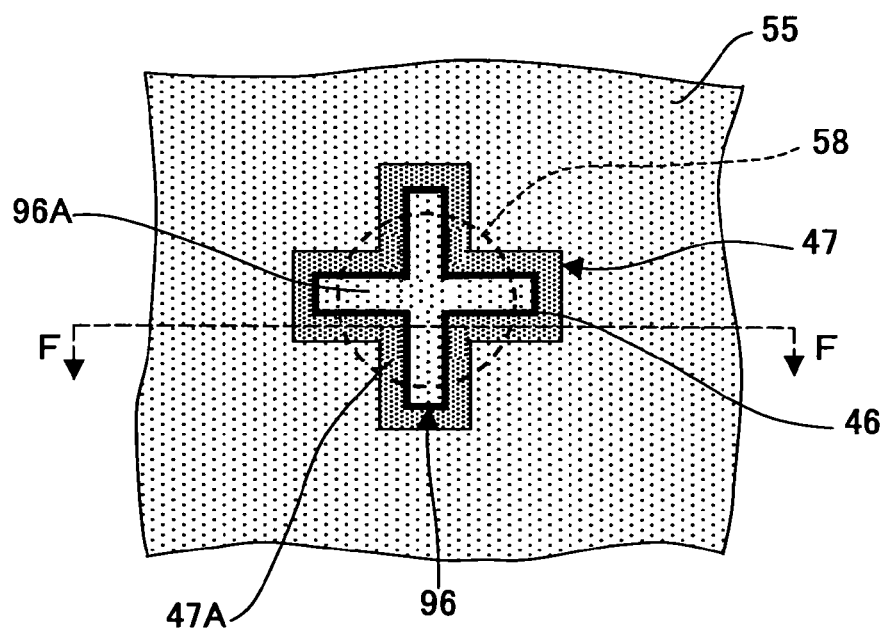
FIG. 27 is a plan view showing a connection state between the projecting portion 96 and a via in the multilayer interconnection board according to the present embodiment of the present invention.

FIG. 27 is a plan view showing a connection state between the projecting portion 96 and a via in the multilayer interconnection board according to the present embodiment of the present invention.

Figure 28:
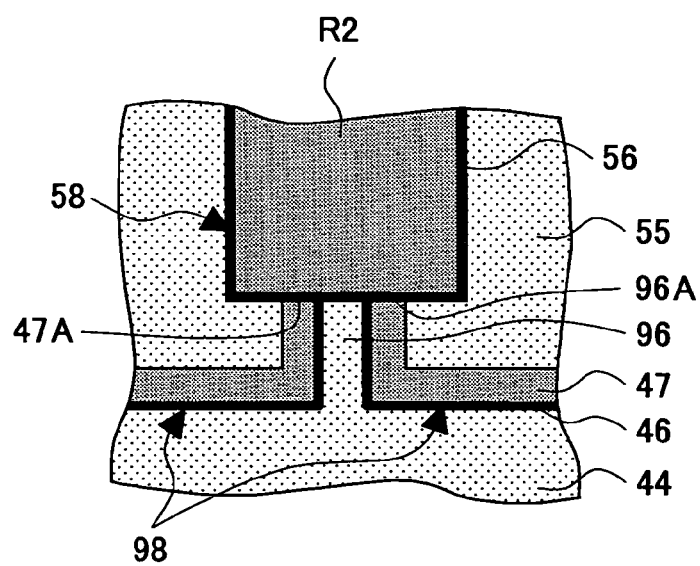
FIG. 28 is a cross-sectional view along a line F—F in FIG. 27, showing the connection state between the projecting portion 96 and the via in the multilayer interconnection board according to the present embodiment of the present invention.

FIG. 28 is a cross-sectional view along a line F—F in FIG. 27, showing the connection state between the projecting portion 96 and the via in the multilayer interconnection board according to the present embodiment of the present invention.

As shown in FIG. 25 through FIG. 28, the projecting portion 96 is in a cross shape, and has a height of H1. The projecting portion 96 is formed in the second interconnection groove 95 having a greater width and a greater area than the first interconnection groove. The projecting portion 96 is formed such that the upper surface 96A of the projecting portion 96 is at the same height as the upper surface 44A of the resin 44, and the side surfaces of the projecting portion 96 are covered by a metal layer including the seed layer 46 and the plating film 47. The upper surface 47A of the plating film 47 and the upper surface 96A of the projecting portion 96 form a flat surface, and the via 58 is provided on the projecting portion 96 with the metal formed thereon.

In this way, because the lengths L1, L2 of the projecting portion 96 are set greater than the diameter R2 of the via 58, even when the via 58 is misaligned relative to the projecting portion 96 more or less, the second interconnection 98 and the via 58 can be reliably electrically connected.

The multilayer interconnection board having the projecting portion 96 according to the second embodiment can be fabricated by the same method as that described in the first embodiment by using the tool 90 to replace the tool 65.

Third Embodiment

Below, a tool 100 used for forming a multilayer interconnection board according to a third embodiment of the present invention is described with reference to FIG. 29 and FIG. 30.

Figure 29:
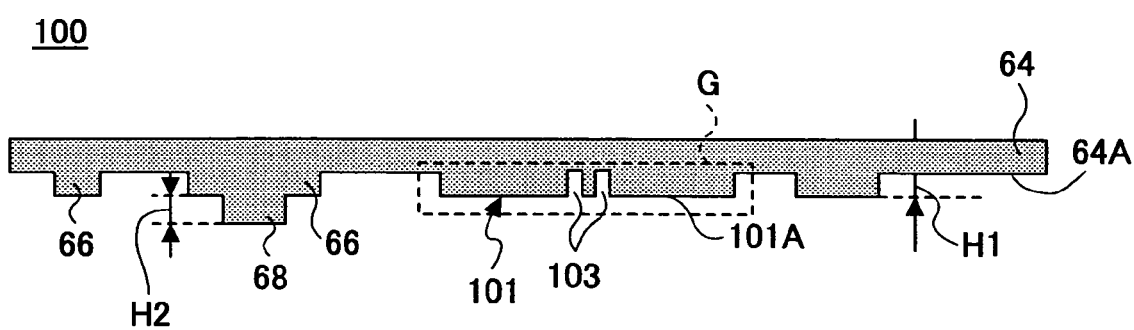
FIG. 29 is a cross-sectional view of the tool 100 for forming the multilayer interconnection board according to the third embodiment of the present invention.

FIG. 29 is a cross-sectional view of the tool 100 for forming the multilayer interconnection board according to the third embodiment of the present invention.

Figure 30:
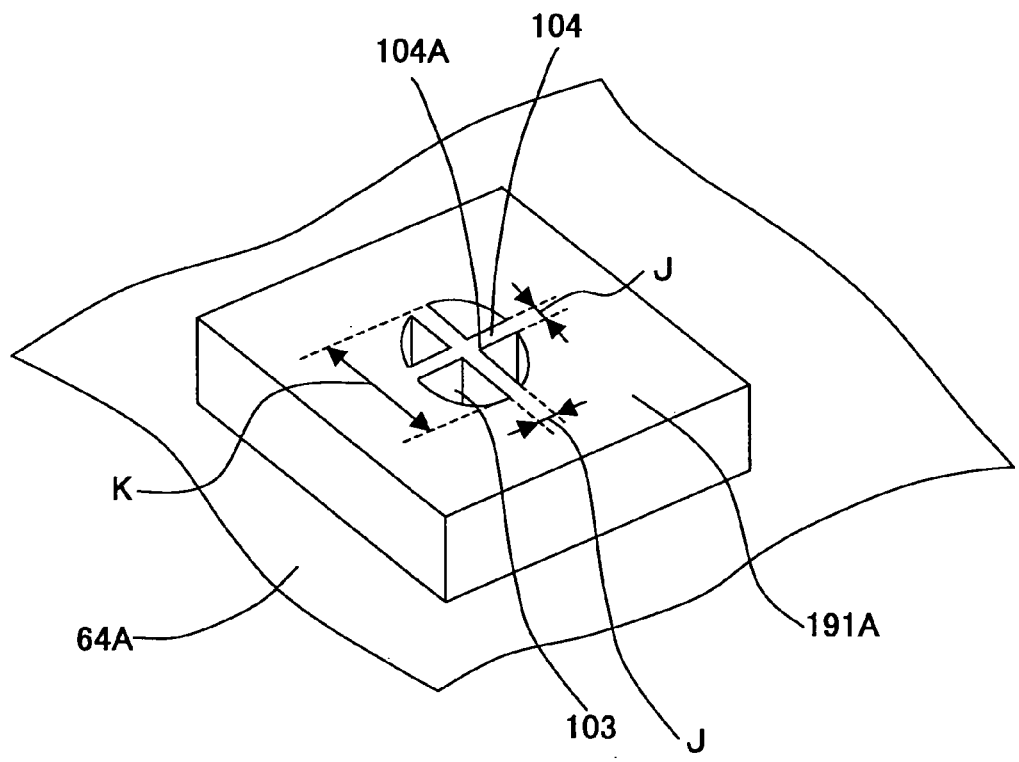
FIG. 30 is an enlarged perspective view of a portion G of the tool 100, as indicated by dashed lines in FIG. 29.

FIG. 30 is an enlarged perspective view of a portion G of the tool 100, as indicated by dashed lines in FIG. 29.

In FIG. 29 and FIG. 30, the same reference numbers are assigned to the same elements as those of the tool 65 shown in FIG. 7, and overlapping descriptions are omitted.

Figure 31:
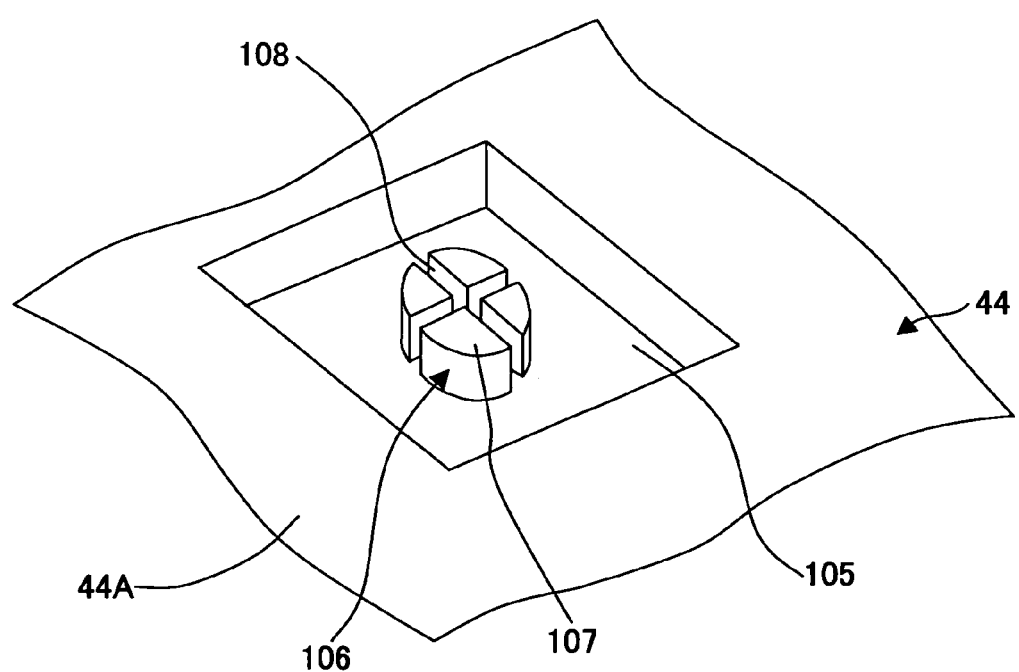
FIG. 31 is an enlarged perspective view of the projecting portion 106 formed by using the tool 100 in FIG. 29, according to the present embodiment of the present invention.

As illustrated in FIG. 29, the tool 100 includes a substrate 64, a first projecting portion 66 for forming the first interconnection groove, a second projecting portion 101 for forming a second interconnection groove having a width and an area greater than those of the first interconnection groove, a third projecting portion 68 for forming a via hole, and a depressed portion 103 for forming a projecting portion 106 (refer to FIG. 31).

The depressed portion 103 includes four open sectors, and between four open sectors, two ridges form a cross-shape frame 104, each of the ridge having a width of J. The upper surface 104A of the frame 104 and the upper surface 101A of the second projecting portion 101 are in the same surface. The length K of the frame 104 is less than the diameter R2 of the via 58.

Figure 32:
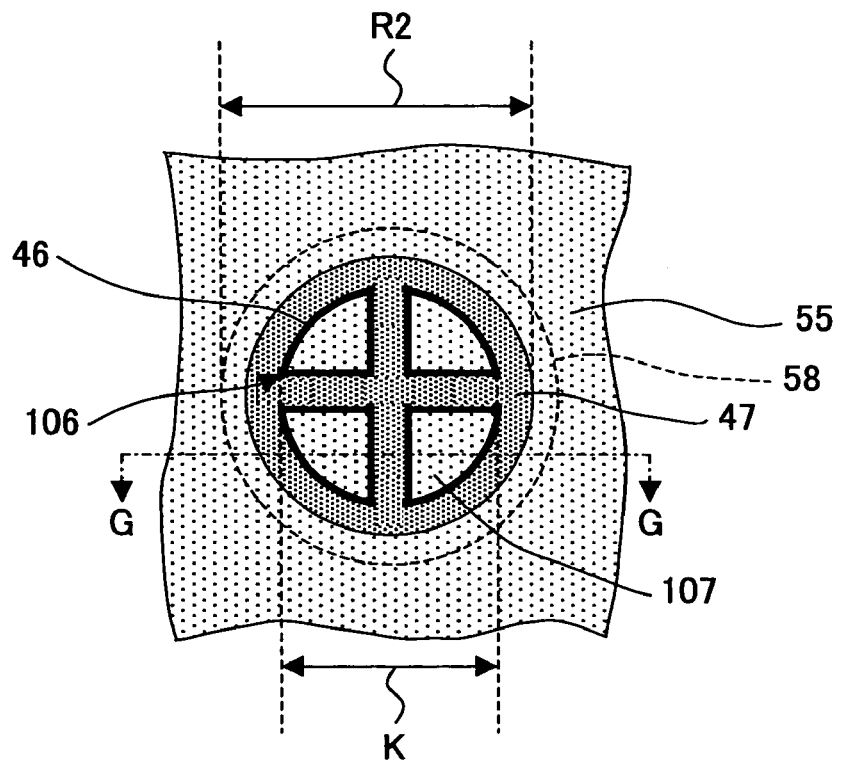
FIG. 32 is a plan view showing a connection state between the projecting portion 106 and a via in the multilayer interconnection board according to the present embodiment of the present invention.
Figure 33:
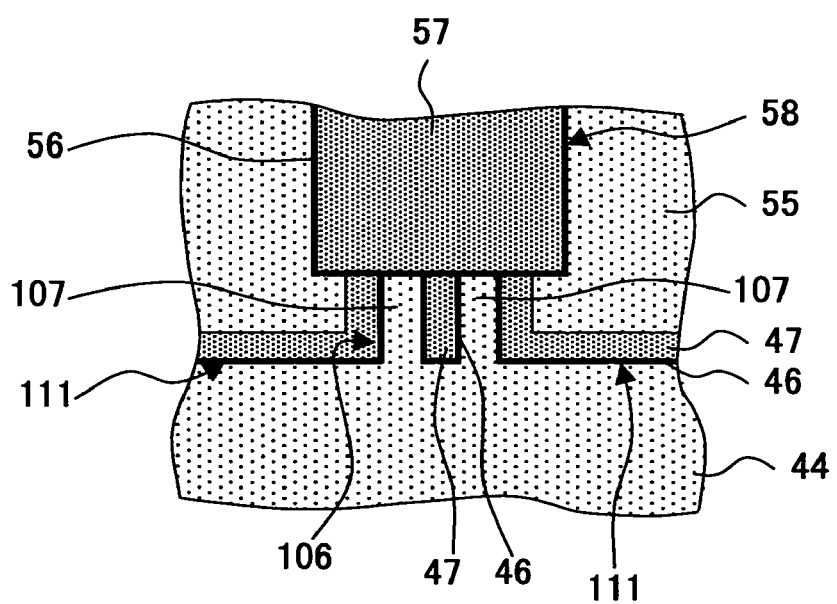
FIG. 33 is a cross-sectional view of the multilayer interconnection board of the present embodiment along a line G—G in FIG. 32, showing the connection state between the projecting portion 106 and the via.

Below, descriptions are made of the projecting portion 106 according to the present embodiment of the present invention with reference to FIG. 31 through FIG. 33. In FIG. 31 through FIG. 33, the same reference numbers are assigned to the same elements as those shown in FIG. 22, and overlapping descriptions are omitted.

FIG. 31 is an enlarged perspective view of the projecting portion 106 formed by using the tool 100 in FIG. 29, according to the present embodiment of the present invention.

FIG. 32 is a plan view showing a connection state between the projecting portion 106 and a via in the multilayer interconnection board according to the present embodiment of the present invention.

FIG. 33 is a cross-sectional view of the multilayer interconnection board of the present embodiment along a line G—G in FIG. 32, showing the connection state between the projecting portion 106 and the via.

As shown in FIG. 31 through FIG. 33, the projecting portion 106 is formed in the second interconnection groove 105 having a greater width and a greater area than the first interconnection groove.

The projecting portion 106 includes four prisms 107 each having a bottom face and a top face in a sector shape, and there are two grooves 108 between the four prisms which form a cross shape.

As illustrated in FIG. 32, the grooves 108, and the side surfaces of the four prisms 107 and the grooves 108 are covered by a metal layer including the seed layer 46 and the plating film 47, and the via 58 is provided on the projecting portion 106 with the metal formed thereon.

In this way, because of the cross-shaped grooves 108 on the projecting portion 106, and the length K of the projecting portion 106 being set less than the diameter R2 of the via 58, the contacting area between the via 58 and the plating film 47 increases, and the second interconnection 111 and the via 58 can be reliably connected electrically.

The multilayer interconnection board having the projecting portion 106 according to the third embodiment can be fabricated by the same method as that described in the first embodiment by using the tool 100 to replace the tool 65.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

For example, the projecting portion for electrical connection may have any shape but not limited to those of the projecting portions 53, 96, and 106, as long as a plating film for connection with a via can be provided.

According to the present invention, in a multilayer interconnection board, which is produced by repeatedly performing the step of pressing a tool, which has projecting portions for forming interconnection grooves and via holes, against an insulating resin, that is, by carrying out pressing working to form interconnection grooves and via holes at the same time, and the step of forming a metal layer on the whole surface of the insulating resin including the interconnection grooves and via holes, and then performing surface polishing to remove the metal on the surface of the insulating resin other than the interconnection patterns, a via provided in the via hole formed by pressing the tool on the insulating resin and an interconnection groove having a large width and a large area can be reliably connected electrically.

This patent application is based on Japanese Priority Patent Application No. 2004-001419 filed on Jan. 6, 2004, the entire contents of which are hereby incorporated by reference.

What is claimed is:

1. A multilayer interconnection board, comprising:
a plurality of stacked interconnection layers, each of said interconnection layers including a first interconnection that is formed by plating a metal in a first interconnection groove in an insulating member, and a second interconnection that is formed by plating the metal in a second interconnection groove in the insulating member, said second interconnection groove having a width and an area greater than a width and an area of the first interconnection groove; and
a via formed for electrically connecting the second interconnections in different interconnection layers;
wherein
a projecting portion for electrical connection is formed integrally with the insulating member in the second interconnection groove, and a metal is provided on the projecting portion to electrically connect the second interconnection with the via.

2. The multilayer interconnection board as claimed in claim 1, wherein
a height of the projecting portion is equal to a depth of the second interconnection groove, and
the metal provided on the projecting portion and an upper surface of the projecting portion form a flat surface.

3. The multilayer interconnection board as claimed in claim 1, wherein the projecting portion is substantially a cylindrical projection.

4. The multilayer interconnection board as claimed in claim 1, wherein the projecting portion is substantially a cross-shaped projection.

5. The multilayer interconnection board as claimed in claim 1, wherein the projecting portion has cross-shaped grooves at a center portion thereof.

* * * * *